United States Patent [19]

Takayama et al.

[11] Patent Number: 4,607,186

[45] Date of Patent: Aug. 19, 1986

[54] ULTRASONIC TRANSDUCER WITH A PIEZOELECTRIC ELEMENT

[75] Inventors: Ryoichi Takayama, Suita; Akira Tokushima, Kyoto; Nozomu Ueshiba, Neyagawa; Yukihiko Ise, Toyonaka, all of Japan

[73] Assignee: Matsushita Electric Industrial Co. Ltd., Kadoma, Japan

[21] Appl. No.: 439,549

[22] Filed: Nov. 5, 1982

[30] Foreign Application Priority Data

Nov. 17, 1981 [JP] Japan ............................ 56-184600
Nov. 20, 1981 [JP] Japan ............................ 56-187557
Jun. 3, 1982 [JP] Japan ............................ 57-95428

[51] Int. Cl.4 ........................................ H01L 41/08
[52] U.S. Cl. ........................ 310/324; 179/110 A; 310/322
[58] Field of Search ............ 310/321, 322, 324, 328, 310/334; 179/110 A

[56] References Cited

U.S. PATENT DOCUMENTS 2,607,858 8/1952 Mason ............................ 310/124
3,025,359 3/1962 Schilling et al. ............ 179/110 A
3,103,559 9/1963 Ward ............................ 179/110 A
3,243,674 5/1966 Desmares ........................ 310/322
3,278,695 10/1966 Craig et al. .................. 179/110 A
3,360,664 12/1967 Straube ........................ 310/324
3,439,128 4/1969 Sobel et al. .................. 179/110 A
3,749,854 7/1973 Mifune et al. .................. 179/110
3,786,202 1/1974 Schafft ........................ 310/322
4,011,473 3/1977 Massa ............................ 310/324
4,035,672 7/1977 Beaverson et al. .............. 310/324
4,079,213 3/1978 Bage et al. .................... 179/110 A
4,122,365 10/1978 Stephens ...................... 310/324
4,220,831 9/1980 Zink ............................ 179/110 A
4,292,561 9/1981 Martin .......................... 310/324 X
4,325,060 4/1982 Purtell ........................ 310/324 X
4,337,640 7/1982 Muranaka et al. .............. 310/322 X
4,368,400 1/1983 Taniguchi et al. .............. 310/322
4,456,849 6/1984 Takayama et al. .............. 310/324
4,458,170 7/1984 Takayama et al. .............. 179/110 A

FOREIGN PATENT DOCUMENTS

0053947A1 6/1982 European Pat. Off. .
1301808 7/1962 France .
82/00543 2/1982 PCT Int'l Appl. .............. 310/324

*Primary Examiner*—Mark O. Budd
*Attorney, Agent, or Firm*—Cushman, Darby & Cushman

[57] ABSTRACT

An ultrasonic transducer having, in a throat part of a horn, a piezoelectric element and a diaphragm connected by a connection rod to the piezoelectric element. A disk having a plurality of apertures is disposed in front of the diaphragm, thereby improving the directivity and sensitivity without losing transient characteristic, making the transducer very suitable for ultrasonic distance measurement in air.

21 Claims, 45 Drawing Figures

ULTRASONIC TRANSDUCER WITH A PIEZOELECTRIC ELEMENT

BACKGROUND OF THE INVENTION

1. Field of the Invention

The present invention relates to an improvement in an ultrasonic transducer using a laminated piezo-electric element and more particularly to an ultrasonic transducer with improved directivity characteristics and improved sensitivity without losing transient characteristics (pulse characteristics) and is suitable, for example, for supersonic distance measurement.

2. Description of the Prior Art

Ultrasonic transducer for use in the air has been proposed and includes laminated piezo-electric ceramic elements which are designed to work at resonance point or anti-resonance point. Further, since the mechanical impedance of air is very much smaller than that of the peizoelectric ceramic element, the laminated element is connected to a diaphragm for attaining mechanical impedance matching therebetween.

For instance, in a video camera having an automatic focussing mechanism for its objective lens by means of ultrasonic distance measurement, the measurement must be made continuously. Such continuous measurement requires a good transient characteristic in order to avoid error in measurement. For such good transient measurement, short rise and fall times are necessary. On the other hand, in such video camera using zoom lens as an objective lens, a distance measurement for such zoom lens must be made with a sharp directivity corresponding to the narrowest picture angle of the zoom lens.

Hitherto, a ceramic ultrasonic transducer has been known as the apparatus of a high sensitivity, high durability against moisture or acidic or salty atmosphere and high S/N ratio due to its resonance characteristic. But the ceramic ultrasonic transducer has had bad transient characteristic due to its very high mechanical Q value.

A typical example of conventional ultrasonic transducer is shown in FIG. 1, which is a sectional elevation view along its axis. As shown in FIG. 1, a lower end of a coupling shaft 2 is fixed passing through a central portion of a laminated piezo-electric element 1 with the upper part secured to a diaphragm 3. The laminated piezo-electric element 1 such as a ceramic piezo-electric element is mounted at positions of nodes of oscillation via a flexible adhesive 5 on tips of supports 4. Lead wires 9, 9' of the laminated piezo-electric element is connected to terminals 6, 6'0 secured to base 71 of a housing 7, which has a protection mesh 8 at the opening thereof. And an outer casing 10' is formed integral with a horn 10.

FIG. 2 is a directivity diagram showing directivity for ultrasonic wave of the transducer of FIG. 1, wherein driving frequency is 40 KHz and the diameter of the horn opening is 42 mm.

In the example of FIG. 1, the half width angle and intensity of a first side lobe are calculated as 16.4° and −17.6 dB, respectively, but in an actual transducer it is difficult to realize a value smaller than these values. If a high resolution for an object is intended to be achieved, a sharp directivity characteristic is required. A sharp directivity characteristics is obtained as is well known by increasing sizes of sound source i.e. diaphragm size or by raising frequency to be transmitted. However, if the frequency to be transmitted is raised, attenuation of the ultrasonic wave becomes larger. Then, when a laminated piezo-electric element is used, the ultrasonic transducer loses its sensitivity, and therefore the raising of the frequency should be limited. And in actual case, the size (i.e. the diameter) of the ultrasonic source must be made larger. Besides, when the laminated piezo-electric ceramic is used and very sharp directivity characteristics are required, the diaphragm, the laminated piezo-electric element and the base to support the piezo-electric element become very large. On the other hand, when a large diaphragm is used in order to realize a sharp directivity characteristic and thereby a high sensitivity, it is difficult to obtain an ideal piston vibration of the diaphragm, and accordingly the sensitivity or directivity characteristic is not improved much. In order to obtain a sharp directivity characteristic, there is another way of adding a horn before the diaphragm. But when a large diaphragm is used for a high sensitivity of transmission and receiving, a sharp directivity is hardly obtainable even by use of such horn.

SUMMARY OF THE INVENTION

Therefore the purpose of the present invention is to provide an improved ultrasonic transducer wherein both sharp directivity and high sensitivity are compatible without losing sharp transient characteristic, suitable for high speed data sending and receiving of ultrasonic distance measurement in a very short time.

An ultrasonic transducer in accordance with the present invention comprises:

a transducing element, a diaphragm connected at its substantial center part of the transducing element, a disk having at least plural apertures and disposed in front of the diaphragm, and a horn containing the transducing element and the diaphragm in a space therein.

DESCRIPTION OF THE PREFERRED EMBODIMENT

Figure 1:
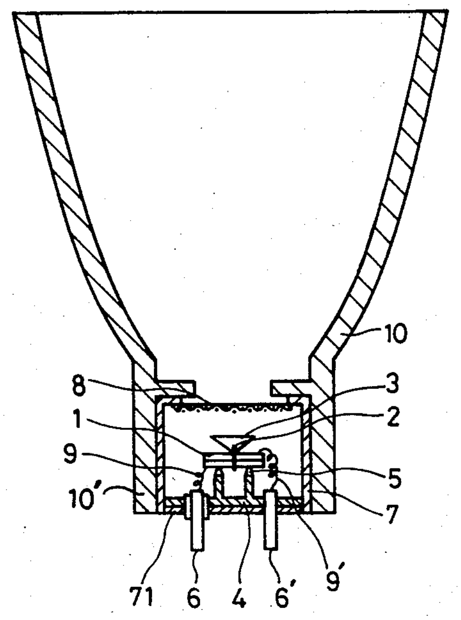
FIG. 1 (Prior Art)
FIG. 1 is a sectional view of the conventional ultrasonic transducer.
Figure 2:
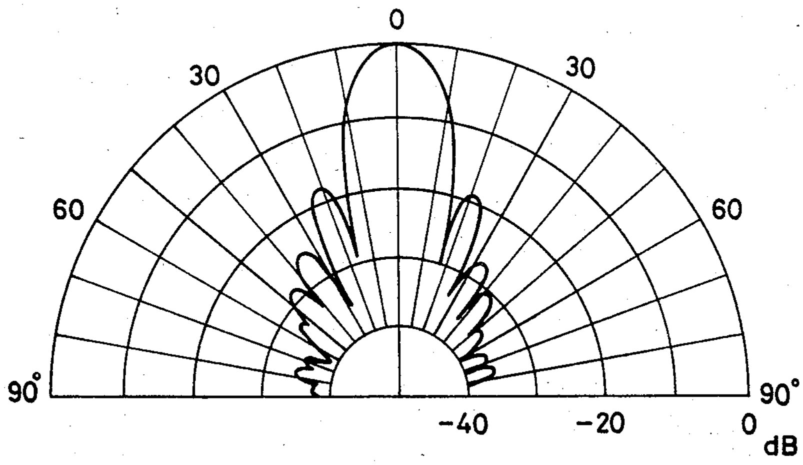
FIG. 2 (Prior Art)
FIG. 2 is a graph showing directivity characteristics of the conventional ultrasonic transducer of FIG. 1.
Figure 3:
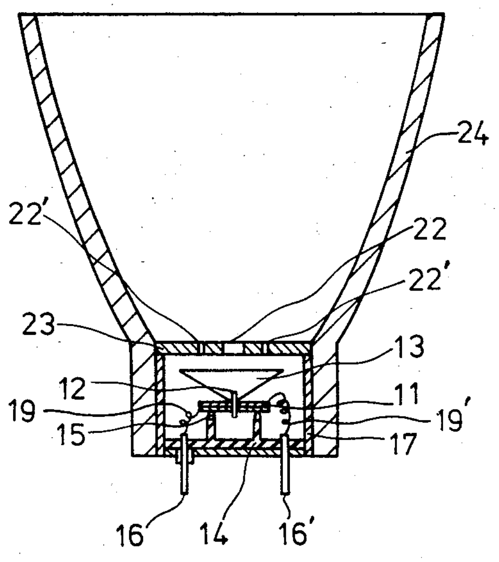
FIG. 3 is a sectional elevation view of an ultrasonic transducer embodying the present invention.
Figure 4A:
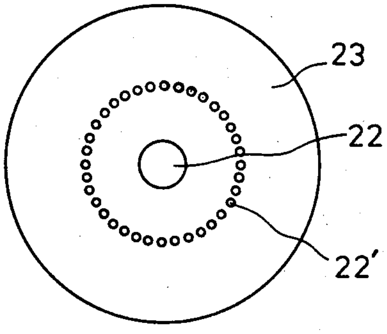
FIG. 4(A) and FIG. 4(B) are a plan view and sectional side view of a disk in the transducer of FIG. 3, respectively.
Figure 4B:
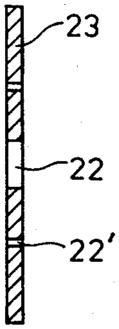

FIG. 3 is a sectional elevation view on a plane including the axis of an embodiment of the present invention. As shown in FIG. 3, a diaphragm 13 made of metal film or plastic film is fixed to a coupling shaft 12 which is coupled with a central parts of a transducing element, such as laminated type piezo-electric element 11, and node part of vibration of the piezo-electric element 11 is supported by a resilient adhesive 15 on a supporter 14. In front of the diaphragm 13, a disk 23 is provided in a coaxial relation with said diaphragm 13. The disk 23 has at least two or more apertures 22 and 22'. The laminated type piezo-electric element 11 and the diaphragm 13 are disposed in a casing 17, which is together with the disk 23 disposed in a throat part of a horn 24 of, for instance, a parabolic shape. Lead wires 19, 19' of the laminated type piezo-electric element 11 are connected to a pair of terminals 16, 16'. Apertures 22, 22' should have different shape and size corresponding to thickness and size of the piezo-electric element 11 and diaphragm 13. Typical examples of such disks are shown in FIG. 4(A), FIG. 4(B), FIG. 5(A), FIG. 5(B), FIG. 6(A), FIG. 6(B), FIG. 7(A), FIG. 7(B), FIG. 8(A), FIG. 8(B), FIG. 9(A), FIG. 9(B), FIG. 10(A), FIG. 10(B), FIG. 11(A), FIG. 11(B), FIG. 12(A), FIG. 12(B), FIG. 13(A), FIG. 13(B), FIG. 14(A), FIG. 14(B), FIG. 15(A), FIG. 15(B), FIG. 16(A), FIG. 16(B), FIG. 17(A), FIG. 17(B), FIG. 18(A), FIG. 18(B), FIG. 19(A), FIG. 19(B), and FIG. 20(A) and FIG. 20(B).

FIG. 21(A) and FIG. 21(B) show directivity characteristics of ultrasonic transducer embodying the present invention and conventional ultrasonic transducer, respectively. The example of FIG. 21(A) is the ultrasonic transducer using the disk of FIG. 5(A) and FIG. 5(B). As can be understood from the comparison of FIG. 21(A) and FIG. 21(B), the provision of the perforated disk 23 decreases the half width angle and intensity of side lobes. Furthermore, by provision of the disk, the directivity becomes uniform around the axis of the transducer, and sensitivities of transmission and receiving both increase by about 6 dB.

Figure 22:
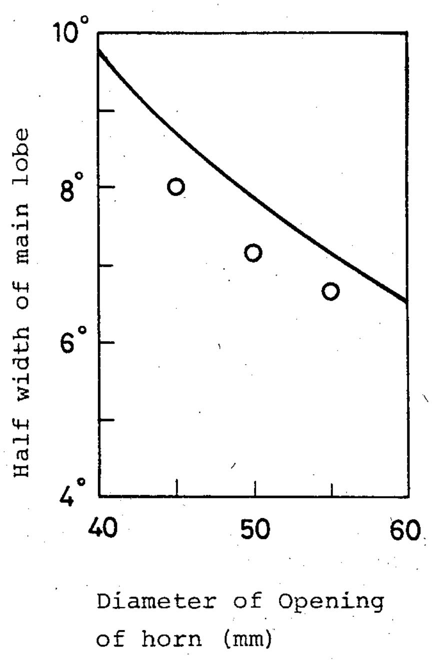
FIG. 22 is a graph comparatively showing measured characteristic of the present invention and calculated curve.

FIG. 22 shows a relation between the diameter of opening of the horn 24 and measured half width angle together with a curve of a calculated half width angle of sound pressure of a diaphragm making piston vibration, at a transmission frequency of 70 kHz. In the graph of FIG. 22, the curve shows calculated relation between the diameter of opening of horn and the calculated half width of main lobe. Small circles show measured data of the example of the present invention. The above-mentioned half width angle of sound pressure is the angle defined that, with respect to directivity factor $R(\theta)$ given by the equation, $$R(\theta) = \frac{2 \cdot J_1(k \cdot a \cdot \sin\theta)}{k \cdot a \cdot \sin\theta}.$$

When the $R(\theta)=\frac{1}{2}$, where $J_1$ is a first kind Bessel function, "a" is radius of sound source, and k is number of waves. The calculation is made under the provision that a circular diaphragm makes an ideal piston vibration. The above-mentioned equation shows that a first sidelobe has an intensity 17.6 dB lower than that of the main lobe. FIG. 22 shows that the ultrasonic transducer in accordance with the present invention has smaller half width angle and smaller half side lobe intensity.

The disks with small perforations 22' shown in FIG. 4(A) to FIG. 7(B) have the feature of small side lobes, and are good for guarding the diaphragm.

The disks with tapered edge at the central aperture 22 shown by FIG. 7(A) to FIG. 8(B) have the features of sharp directivity and smallness of undesirable reasonance of the disk.

The disks with high aperture rate such as shown in FIG. 9(A) and FIG. 9(B), FIG. 15(A) and FIG. 15(B), FIG. 17(A) and FIG. 17(B), FIG. 18(A) to FIG. 19(B) have the feature of low temperature dependency of resonance frequency.

The disks with a concave front face by radially changing thickness have good directivity when the concave front face is disposed to form a continuous curved face together with inner wall of the horn.

The disks with a convex face towards the diaphragm have the feature of low temperature dependency as a result of smallness of cavity forming space between the diaphragm 13 and the disk 23.

The disks with various ring shaped aperture(s) are effective in compensating or changing when combination of piezo-electric element 11 and diaphragm 13 has peculiar characteristics.

The wide variety of aperture shape, size and disposition as shown from FIG. 4(A) to FIG. 20(B) enables it to complement a wide variety of characteristics of the transducing element and diaphragm.

Figure 23:
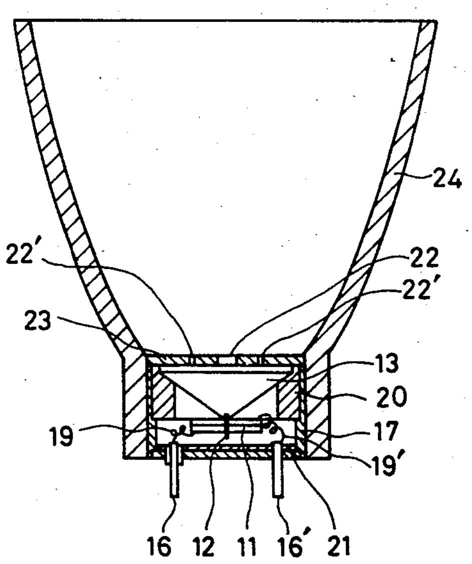
FIG. 23 is a sectional elevation view of another embodiment of the present invention.

FIG. 23 shows another example wherein a diaphragm capable of higher mode vibration composed of metal or plastic film 13 is fixed by a coupling shaft 12 in coaxial relation to a laminated type piezo-electric element 11. A peripheral part of the diaphragm 13 is supported with a ring-shaped buffer member 20 made of absorbing material such as silicon rubber, so as to suppress conduction of ultrasonic vibration to the inner wall of a cylindrical case 17. In front of the diaphragm 13 there is provided a disk having at least two or more apertures disposed concentric with the axis of the diaphragm. The case 17 and the disk 23 are fixed in the throat part of a parabolic horn 24. Lead wires 19, 19' of the laminated piezo-electric element 11 are connected to terminals 16, 16'.

Figure 21:
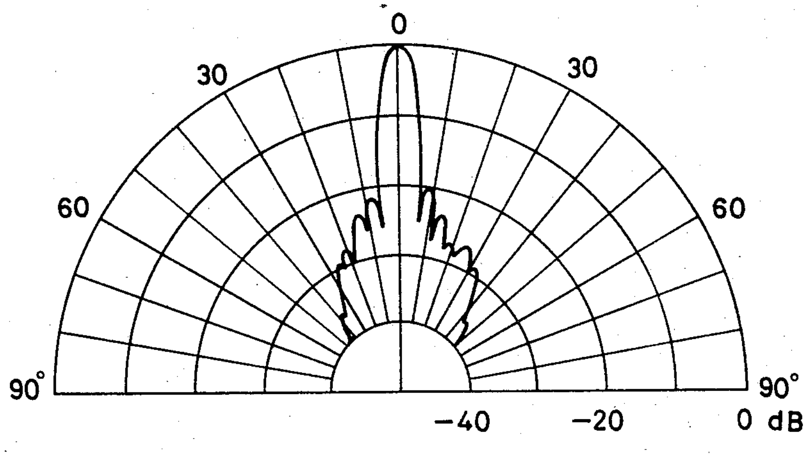
FIG. 21(A) and FIG. 21(B) are directivity characteristic diagrams for comparatively showing the example of the present invention and the inventional device.
Figure 21:
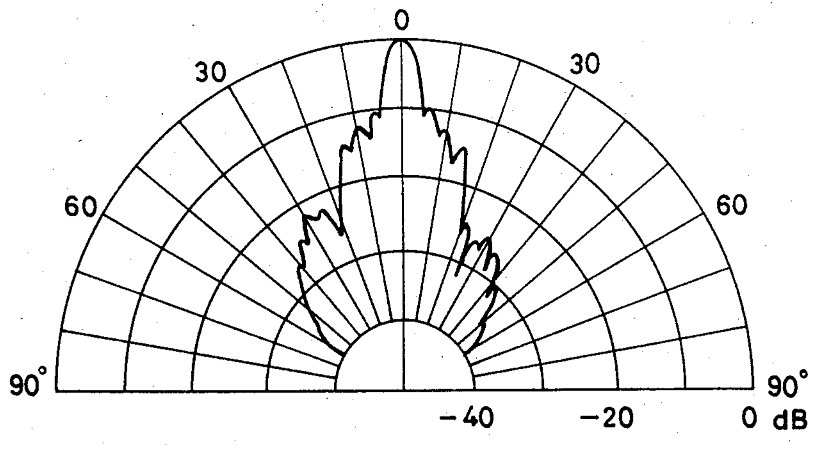

Directivity characteristic of this example shown in FIG. 23 is also sharp and has low side lobes the same as shown in FIG. 21 and FIG. 22.

Figure 24:
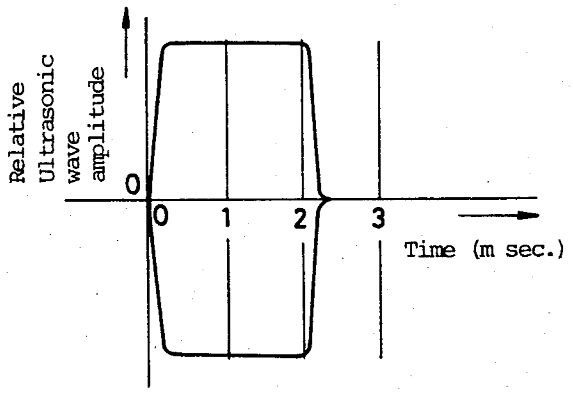
FIG. 24 is a time chart showing a transient characteristic of an embodiment of the present invention.

FIG. 24 shows the transient characteristic of the ultrasonic transducer embodying the present invention. FIG. 24 shows that rise time and fall time are about 0.15 ms, and if too high sensitivity is not necessary, further short rise and fall time of 0.1 ms is attainable. That is, the transducer of the present invention has a sharp transient characteristic. This means that as a result of short rise time and short fall time, the distance measurement reliability and accuracy is much improved. Furthermore, when ultrasonic transmission and receiving is made with the same transducer, after transmitting an ultrasonic signal an immediate reception is possible thereby making measurable range at a very short distance possible, which is very often required for distance measurement for a video tape recorder camera or the like cameras.

Inventor's many experiments confirmed that all of the examples of disks of FIG. 4(A) to FIG. 20(B) show improvements of sensitivity, directivity characteristic or complementability with wide varieties of characteristics of transducing elements and diaphragms.

Figure 5A:
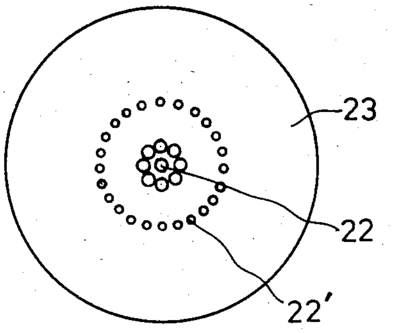
FIG. 5(A) and FIG. 5(B) are a plan view and sectional side view of a disk in the transducer of FIG. 3, respectively.
Figure 5B:
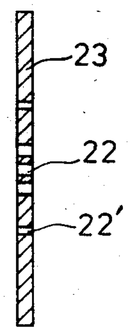
Figure 6A:
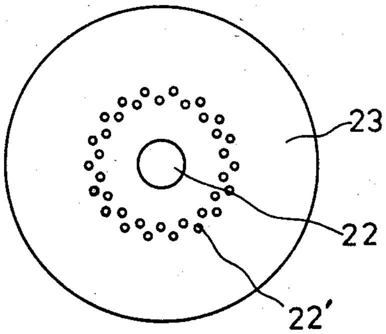
FIG. 6(A) and FIG. 6(B) are a plan view and sectional side view of a disk in the transducer of FIG. 3, respectively.
Figure 6B:
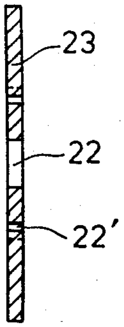
Figure 7A:
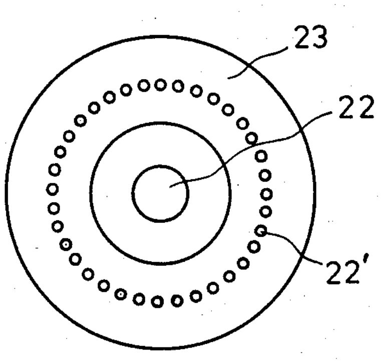
FIG. 7(A) and FIG. 7(B) are a plan view and sectional side view of a disk in the transducer of FIG. 3, respectively.
Figure 7B:
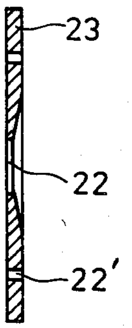
Figure 8A:
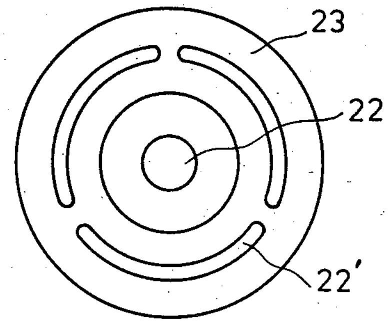
FIG. 8 (A) and FIG. 8(B) are a plan view and sectional side view of a disk in the transducer of FIG. 3, respectively.
Figure 8B:
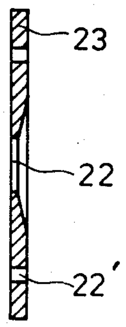
Figure 9A:
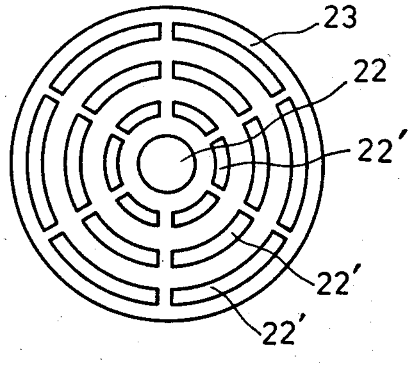
FIG. 9 (A) and FIG. 9(B) are a plan view and sectional side view of a disk in the transducer of FIG. 3, respectively.
Figure 9B:
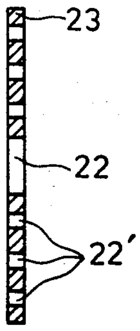
Figure 10:
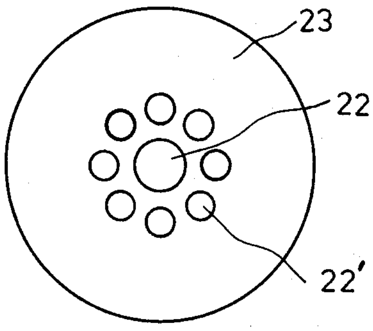
FIG. 10(A) and FIG. 10(B) are a plan view and sectional side view of a disk in the transducer of FIG. 3, respectively.
Figure 10:
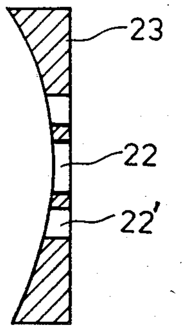
Figure 11:
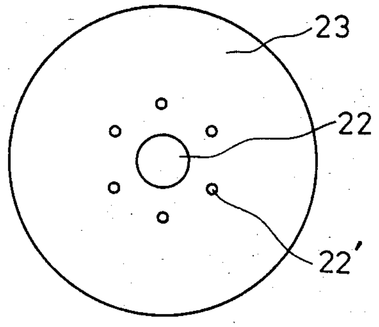
FIG. 11(A) and FIG. 11(B) are a plan view and sectional side view of a disk in the transducer of FIG. 3, respectively.
Figure 11:
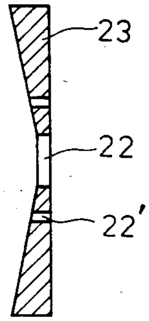
Figure 12:
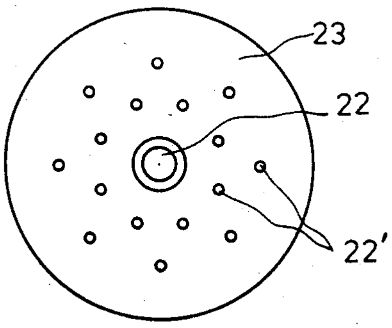
FIG. 12(A) and FIG. 12(B) are a plan view and sectional side view of a disk in the transducer of FIG. 3, respectively.
Figure 12:
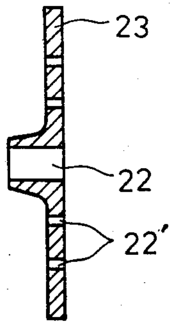
Figure 13:
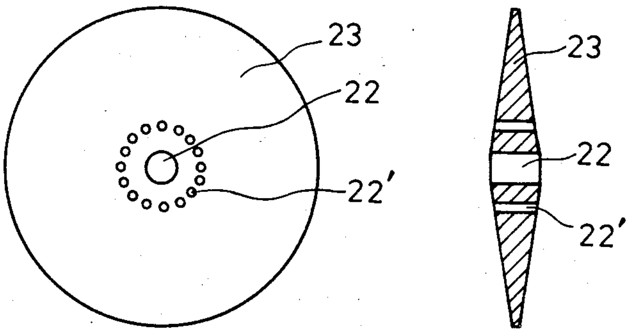
FIG. 13(A) and FIG. 13(B) are a plan view and sectional side view of a disk in the transducer of FIG. 3, respectively.
Figure 14:
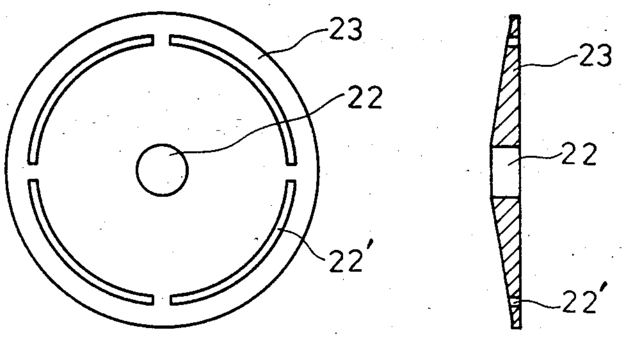
FIG. 14(A) and FIG. 14(B) are a plan view and sectional side view of a disk in the transducer of FIG. 3, respectively.
Figure 15:
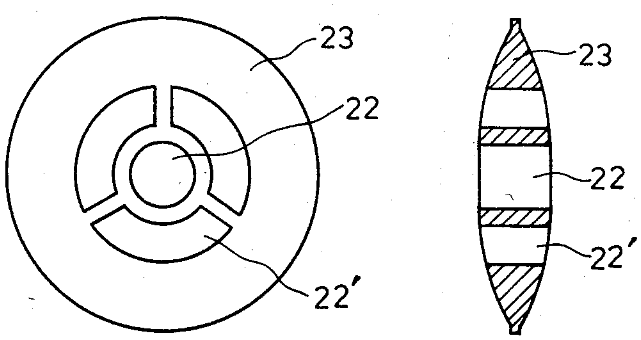
FIG. 15(A) and FIG. 15(B) are a plan view and sectional; side view of a disk in the transducer of FIG. 3, respectively.
Figure 16:
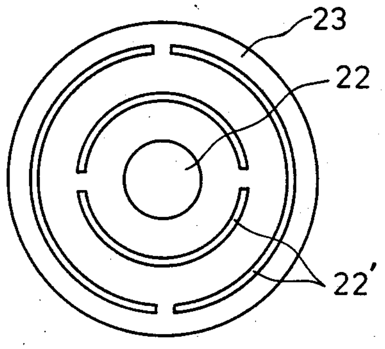
FIG. 16(A) and FIG. 16(B) are a plan view and sectional side view of a disk in the transducer of FIG. 3, respectively.
Figure 16:
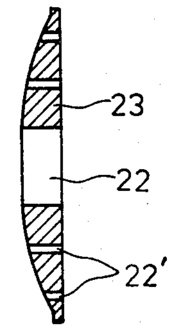
Figure 17:
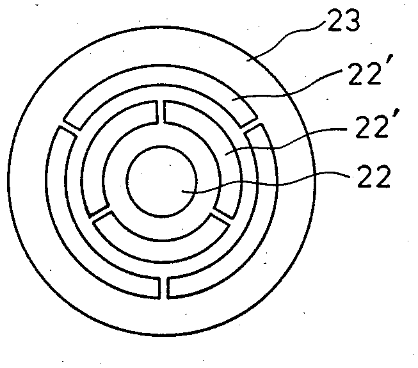
FIG. 17(A) and FIG. 17(B) are a plan view and sectional side view of a disk in the transducer of FIG. 3, respectively.
Figure 17:
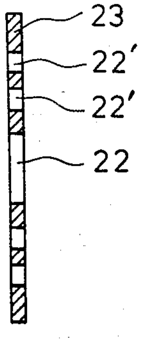
Figure 18:
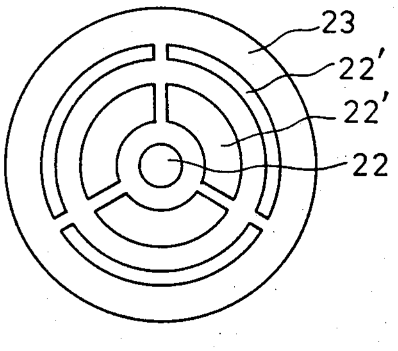
FIG. 18(A) and FIG. 18(B) are a plan view and sectional side view of a disk in the transducer of FIG. 3, respectively.
Figure 18:
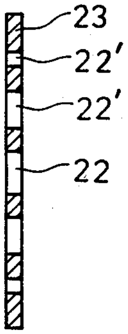
Figure 19:
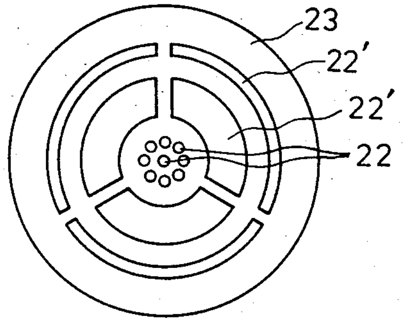
FIG. 19(A) and FIG. 19(B) are a plan view and sectional side view of a disk in the transducer of FIG. 3, respectively.
Figure 19:
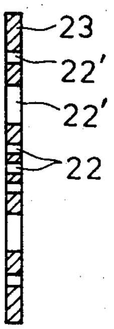
Figure 20:
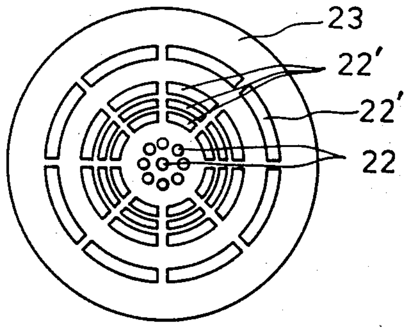
FIG. 20(A) and FIG.(B) are a plan view and sectional side view of a disk in the transducer of FIG. 3, respectively.
Figure 20:
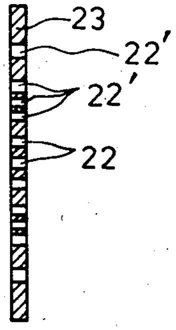
Figure 25:
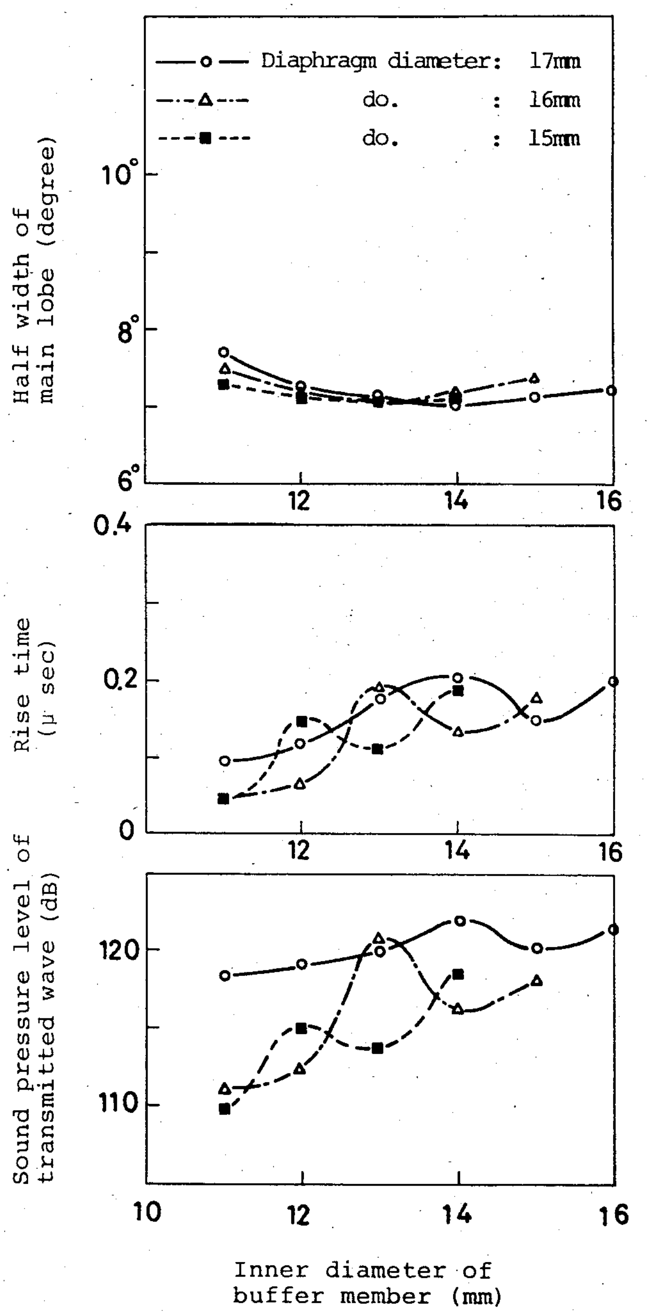
FIG. 25 shows curves showing characteristics of the embodiment of the present invention.

FIG. 25 shows relation between half width of main lobe, rise time and sound pressure level of transmitted wave vs. inner diameters of buffer member of 15 mm, 16 mm and 17 mm. The curves show that as the inner diameter of the buffer member decreases the rise time becomes shorter and sound pressure level becomes lower. Sound pressure level has a peak value when the ratio of inner diameter of the buffer member 20 to the diameter of the diaphragm 13 is between 0.6 and 0.9, and especially at the ratio of 0.8. And at the same time the half width angle of the main lobe is at a minimum. When the inner diameter of the buffer member 20 is made smaller, then the intensity of the side lobe becomes larger (not shown), and the sound pressure level decreases and good transient characteristics are lost. The example transducer has a diameters of the diaphragm 13 of 17 mm, diameter of opening of horn 24 of 55 mm, and the shape of the disk 23 is as shown in FIG. 5(A) and FIG. 5(B), and the ultrasonic frequency is 70 KHz.

As has been described, shapes and size of apertures 22, 22' of the disk 23 for attaining best performance varies depending of shape and size of other component such as piezo-electric element 11 and diaphragm 13. For example when diameter of the laminated piezo-electric element 11 is about 9.1 mm, and 0.6 mm thick, bottom diameter of corn shaped diaphragm 13 is 17 mm, principal resonance frequency is about 70 KHz, and then a disk for attaining best directivity characteriestic is that which has a number of apertures of small circles about 0.5–1 mm disposed on its center and disposed on circles of about 4 mm diameter as shown in FIG. 5(A) and FIG. 5(B).

When an ultrasonic transducer in accordance with the present invention is used at a predetermined frequency, the temperature dependency of sensitivity is influenced by change of sensitivity itself and change of frequency characteristic of the sensitivity.

Figure 26:
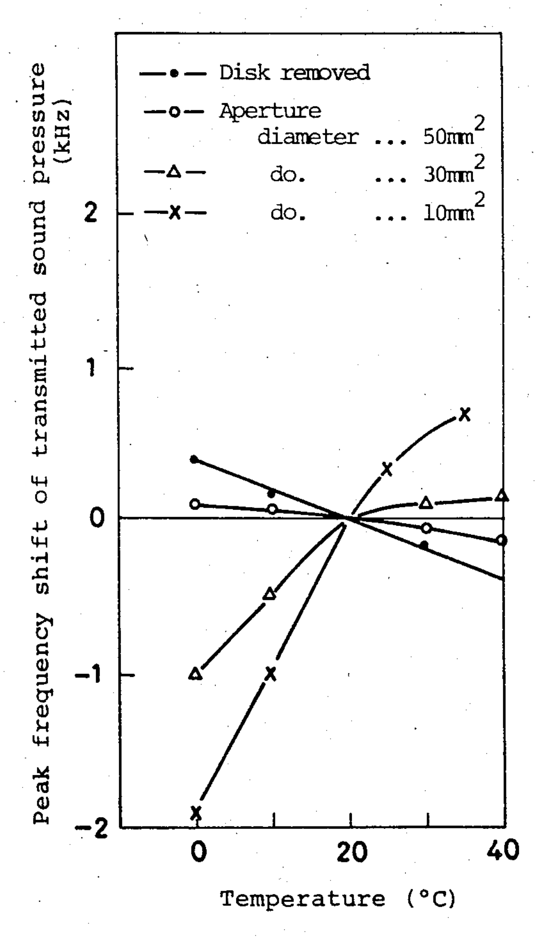
FIG. 26 shows curves showing temperature dependent characteristic of the embodiment of the present invention.

In cast the total area of apertures 22, 22' of the disk is small, the dependency of frequency characteristic of sensitivity increases in comparison with a transducer without the disk. FIG. 26 shows relation between temperature and shift of peak frequency of transmitted sound pressure, taking aperture areas of disk as parameters.

Figure 27:
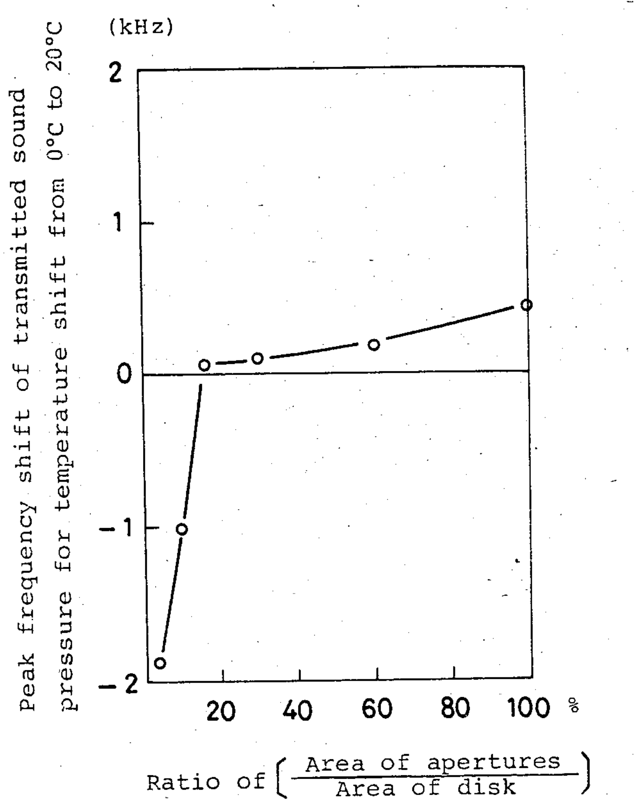
FIG. 27 shows characteristics of the embodiments of the present invention.

FIG. 27 shows a relation between ratio of total area of apertures of a disk to area of the disk vs. temperature-dependent-shift of peak frequency of transmitted sound pressure for temperature shift between 0° C. and 20° C. The curve of FIG. 27 shows that over the value of 15% of the ratio, that is over the aperture area of 50 $mm^2$ the temperature-dependent frequency-shift decreases greatly, and accordingly temperature dependency of sensitivity is improved. Experiments shows that temperature dependent changes of directivity characteristics of ultrasonic transducer in accordance with the present invention are very small.

By unifying the case 17 and disk 23 into one integral metal body or a plastic body, further specially uniform directivity is obtained and dispersion of characteristic decreases and assembly becomes easier.

Furthermore, by forming the case 17 and disk 23 with conductive material and connecting them to the ground line, noise resistivity is much improved.

As has been elucidated with reference to various examples, an ultrasonic transducer in accordance with the present invention has not only a sharp directivity characteristic but also a high sensitivity in transmitting and receiving without losing good transient characteristic. Accordingly, the ultrasonic transducer in accordance with present invention is suitable for a distance measurement or any ultrasonic measurements requiring a sharp directivity characteristic.

What is claimed is:

1. An ultrasonic transducer comprising:

transducer element means for converting between electrical energy and ultrasonic acoustical energy;

diaphragm means, connected at the substantial center thereof to said transducer element means, for coupling acoustical energy to and from said transducer element means;

horn means, including means defining a chamber wherein said transducer element means and diaphragm means are disposed and further including means defining a circular aperture opening into said chamber, said horn means for coupling acoustical energy between said diaphragm means and the air outside said horn means, said horn means having a predetermined directivity pattern; and disc means, covering said aperture defined by said horn means and including means defining plural apertures therethrough, for altering the directivity pattern of said horn means.

2. An ultrasonic transducer in accordance with claim 1, wherein said diaphragm means is capable of higher mode vibration.

3. An ultrasonic transducer is accordance with claim 1, wherein said plural apertures are defined through said disc means on circles concentric with the axis of said transducing element means.

4. An ultrasonic transducer in accordance with claim 3, wherein said disk means has a tapered peripheral part around at least a central aperture.

5. An ultrasonic transducer in accordance with claim 3, wherein said disk means has different thicknesses at a central part thereof and at peripheral parts thereof.

6. An ultrasonic transducer in accordance with claim 3, wherein said plural apertures include at least a set of small perforations.

7. An ultrasonic transducer in accordance with claim 3, wherein said transducing element means comprises a piezo-electric element having a connection member connected to said diaphragm means at a central part thereof.

8. An ultrasonic transducer in accordance with claim 7, wherein said piezo-electric element is of the laminated type.

9. An ultrasonic transducer in accordance with claim 8, which further comprises a buffer member mounted between a peripheral part of said diaphragm means and an inner wall of said housing means for resiliently holding said diaphragm means on said housing means.

10. An ultrasonic transducer in accordance with claim 9, wherein said piezo-electric element is discoid in shape and has a connection member; and said diaphragm means is conic in shape and is connected to said connection member at a top portion thereof.

11. An ultrasonic transducer in accordance with claim 10, wherein the ratio of the inner diameter of said buffer member at the part thereof contacting said diaphragm means to the diameter of the diaphragm means is 0.6–0.9.

12. An ultrasonic transducer in accordance with claim 11, wherein said disk means has plural circular perforations each of diameter of about 0.5–1 mm, a first plurality of said perforations disposed along a first circle of a first diameter, a second plurality of said perforations disposed along a second circle concentric with said first circle, said second circle having a second diameter of about 4 mm.

13. An ultrasonic transducer in accordance with claim 11, wherein said total area of said plural apertures is at least 15% of total area of the principal face of the said disk means.

14. An ultrasonic transducer in accordance with claim 13, wherein said disk means has a round aperture of about 4.5 mm diameter and a number of perforations disposed on concentric circles of about 8.9 mm diameter and about 13.9 mm diameter, and the transducer element means has a resonance frequency at about 70 KHz.

15. An ultrasonic transducer in accordance with claim 13, wherein said disk means has a round aperture of about 2.5 mm diameter and a number of perforations disposed on concentric circles of about 8 mm diameter and 14.4 mm diameter, and the transducer element means has a resonance frequency at about 76 KHz.

16. An ultrasonic transducer in accordance with claim 9, wherein said disk means is formed integral with said horn means.

17. An ultrasonic transducer in accordance with claim 9, wherein said horn means and said disk means are formed integral with a conductive material connected to ground potential.

18. An ultrasonic transducer in accordance with claim 9, wherein said housing means, said disk means and said horn means are formed integral together.

19. A transducer as in claim 1 wherein said apertures are disposed on said disc means at predetermined positions, said disc means for decreasing the half-width angle of a main lobe of said directivity pattern of said horn means and for decreasing the intensity of the side lobes of said pattern.

20. A transducer as in claim 1 wherein said apertures defined through said disk means have sizes and shapes related to the thicknesses and sizes of said transducer element means and/or said diaphragm means.

21. A transducer as in claim 1 wherein said plural apertures are disposed in a symmetrical pattern about any diameter of said disk means.

* * * * *

UNITED STATES PATENT AND TRADEMARK OFFICE
CERTIFICATE OF CORRECTION

PATENT NO. : 4,607,186

DATED : August 19, 1986

INVENTOR(S) : TAKAYAMA et al

It is certified that error appears in the above-identified patent and that said Letters Patent is hereby corrected as shown below:

In the heading,

[30] Foreign Application Priority Data should include:

--Sept. 10, 1982 [JP] Japan..........57-158330--

Signed and Sealed this

Twentieth Day of September, 1988

*Attest:*

DONALD J. QUIGG

*Attesting Officer*

*Commissioner of Patents and Trademarks*